United States Patent [19]
Imazeki et al.

[11] 4,366,433
[45] Dec. 28, 1982

[54] OUTPUT VOLTAGE-DROP DETECTING APPARATUS TECHNICAL FIELD

[75] Inventors: Ryoji Imazeki; Masayuki Hattori, both of Hachioji, Japan

[73] Assignee: Fujitsu Fanuc Limited, Tokyo, Japan

[21] Appl. No.: 243,934

[22] PCT Filed: Jun. 30, 1980

[86] PCT No.: PCT/JP80/00151
§ 371 Date: Mar. 2, 1981
§ 102(e) Date: Feb. 20, 1981

[87] PCT Pub. No.: WO81/00159
PCT Pub. Date: Jan. 22, 1981

[30] Foreign Application Priority Data
Jun. 30, 1979 [JP] Japan .................................. 54-82781

[51] Int. Cl.³ .............................................. G05F 1/64
[52] U.S. Cl. .................................... 323/281; 340/661; 363/127
[58] Field of Search ............... 323/273, 275, 281, 909; 324/103 R, 119; 340/645, 660, 661; 363/126, 127

[56] References Cited
U.S. PATENT DOCUMENTS
3,214,700 10/1965 Hook ................................ 340/661 X
3,813,666 5/1974 Gately ............................. 340/661 X FOREIGN PATENT DOCUMENTS
47-31031 8/1972 Japan.
940784 6/1963 United Kingdom.

Primary Examiner—A. D. Pellinen
Attorney, Agent, or Firm—Stass & Halsey

[57] ABSTRACT

An output voltage-drop detecting apparatus added to a stabilized DC power source device which includes a power control circuit for controlling a DC input voltage to produce a DC output voltage of a specified value, a reference voltage source whose voltage is capable of being varied, and an error amplifier, with the DC output voltage and the reference voltage being compared by the error amplifier and the power control circuit being controlled by the output of the error amplifier to stabilize the output voltage. The output voltage-drop detecting apparatus divides the reference voltage obtained from the reference voltage source which is provided in the stabilized DC power source device, thereby to produce a reference voltage for the output voltage-drop detecting apparatus, and compares this reference voltage and the output voltage by means of a comparator, the arrangement being such that the comparator delivers a detection signal when the output voltage of the stabilized DC power source device drops below the reference voltage for the output voltage-drop detecting apparatus.

3 Claims, 2 Drawing Figures

OUTPUT VOLTAGE-DROP DETECTING APPARATUS TECHNICAL FIELD

BACKGROUND OF THE INVENTION

This invention relates to an output voltage-drop detecting apparatus for a stabilized DC power source, and more particularly to an output voltage-drop detecting apparatus which is well-suited for use in a stabilized DC power source device of the type whose output voltage is capable of being varied.

BACKGROUND ART

A variety of electronic devices, such as electronic computers and numerical control devices, incorporate a stabilized DC power source device for supplying a stabilized voltage to the instruments and components which they contain. Though various stabilized DC power source devices of the above type are available, they are generally provided with a rectifying and smoothing circuit for converting alternating current to direct current, a power control circuit for regulating the output voltage to a constant value, a reference voltage source, and an error amplifier, the alternating current being converted to direct current by the rectifying and smoothing circuit, after which the direct current is applied to the power control circuit. The latter circuit holds the output voltage at a set voltage by executing control in the following manner. Specifically, the output voltage delivered by the power control circuit and the reference voltage of the reference voltage power source are compared constantly by the error amplifier. If the output voltage attempts to drop, this is detected by the error amplifier which sends a signal to the power control circuit, the latter responding by raising the output voltage. If the output voltage attempts to rise, this is detected by the error amplifier which sends a signal to the power control circuit that responds by lowering the output voltage. Hence, the operation is such that the output is held constant at all times.

When it is desired to vary the output voltage in a stabilized DC power source device of the foregoing type, it suffices to divide the voltage of the reference voltage power source by a rheostat, thereby to change the reference voltage which is applied to the error amplifier.

There are cases where it is desired to monitor the output voltage of the abovesaid stabilized DC power source device to determine whether it is constantly within tolerance. There are times, for instance, when the output voltage of the stabilized DC power source is observed to determine whether it has surpassed a specified value, as when the power supply of a numerical control device is turned on, or to determine whether it has dropped below the specified value, as when the power supply of the numerical control device is cut off. In such cases a voltage-drop detecting circuit is provided, the circuit having a reference voltage source, a rheostat for dividing the reference voltage delivered by the reference voltage source, and a comparator, the arrangement being such that the DC output voltage and a detection level voltage set by the rheostat are compared by way of the comparator which issues a detection signal when the DC output voltage exceeds the detection level, this allowing the DC output voltage to be monitored. There are instances when the DC output voltage is varied for testing or other purposes, in the stabilized DC power source employing the voltage-drop detecting circuit of the above type. In such cases it is necessary to subject also the detection level of the voltage to a follow-up change by readjusting also the rheostat of the voltage-drop detecting circuit. This is a very troublesome operation. Furthermore, when the DC output voltage and the detection level of the voltage are close to one another, as when the detection level is greater than 95% of the DC output voltage, accurate detection of the voltage drop cannot be accomplished unless the reference voltage source provided in the voltage-drop detecting circuit is stabilized to a fairly high level of precision. This would raise the cost of manufacturing the stabilized DC power source circuit.

SUMMARY OF THE INVENTION

Accordingly, it is an object of the present invention to provide an output voltage-drop detecting apparatus for a stabilized DC power source device, which apparatus is free of the defects encountered in the conventional output voltage-drop detecting apparatus as described above, and which is simple to operate.

It is another object of the present invention to provide an output voltage-drop detecting apparatus for a stabilized DC power source, which apparatus can by applied easily to a stabilized DC power source circuit of the type whose output voltage is capable of being varied, and which has the ability to set a voltage-drop detection level extremely close to the output voltage of the stabilized DC power source circuit.

The present invention provides an output voltage-drop detecting apparatus which is attached to a stabilized DC power source device having a power control circuit for controlling a DC voltage input to produce a DC voltage output of a specified value, a reference voltage source capable of fixing or varying a reference voltage, and an error amplifier, the latter being adapted to constantly compare the reference voltage and the output voltage delivered by the power control circuit and to send a control signal to the power control circuit when an error begins to develop between the output voltage and the reference voltage, the power control circuit performing a control operation in response to the control signal to eliminate the error, whereby the output voltage is held constant at all times. The function of the output voltage-drop detecting apparatus is to detect a drop in this output. It does this by dividing the reference voltage obtained from the reference voltage source, which is provided in the stabilized DC power source device, to form the reference voltage of the output voltage-drop detecting circuit, which reference voltage serves as a voltage-drop detection level, and by comparing this reference voltage with the output voltage by means of a comparator, the arrangement being such that the comparator issues a detection voltage when the output voltage of the stabilized DC power source device drops below the reference voltage, thereby allowing the drop in the DC output voltage to be detected. In the foregoing arrangement, when the DC output voltage is varied by changing the reference voltage obtained from the reference voltage source provided in the stabilized DC power source device, the reference voltage of the output voltage-drop detecting apparatus varies along with this change and is set to a level relative to the reference voltage of the stabilized DC power source device. Hence, in accordance with the present invention, the operation of the apparatus is simplified since it is not necessary to adjust a reference voltage source for the output voltage-drop detecting circuit even when the output voltage of the stabilized DC power source device is varied. Moreover, since the output voltage-drop detection level can be set by the dividing ratio established by resistors, the detection level can be set extremely close to the output voltage. This can be achieved while maintaining an accuracy sufficient for the particular use even if the dividing resistors themselves do not exhibit sufficient accuracy.

DESCRIPTION OF THE PREFERRED EMBODIMENT

In order to describe the present invention in greater detail, reference will now be had to the accompanying drawings to render a description of an embodiment of the present invention while comparing it to the conventional apparatus.

Figure 1:
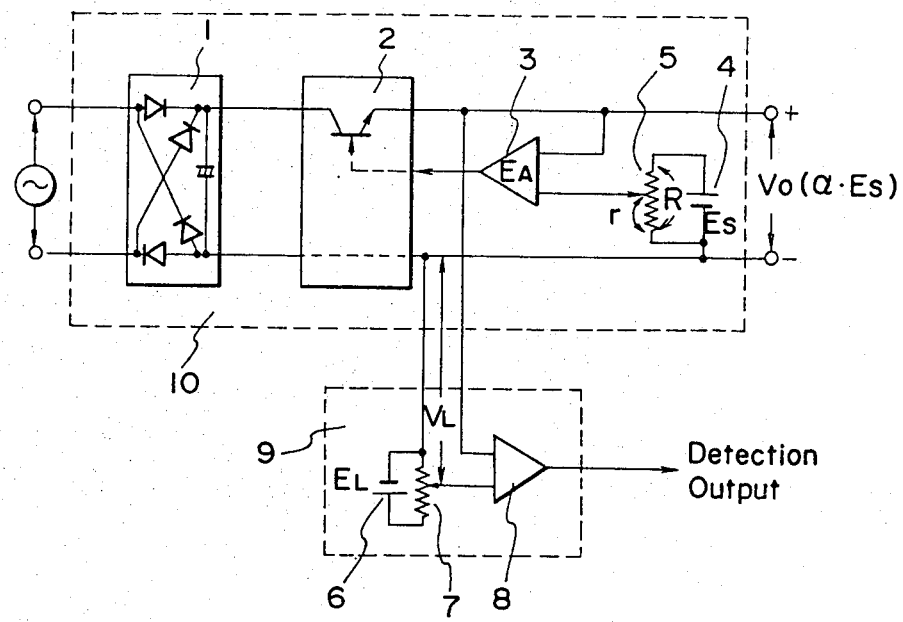
FIG. 1 is a functional block diagram of an output voltage-drop detecting apparatus of a stabilized DC power source device in accordance with the prior art.

Referring now to FIG. 1 showing a functional block diagram of a stabilized DC power source of the type which has been employed conventionally, reference numeral 1 denotes a rectifying and smoothing circuit which includes a rectifier and a capacitor. Reference numeral 2 denotes a power control circuit, 3 an error amplifier, 4 a reference voltage source for stabilization control, and 5 a rheostat for fine adjustment of the output voltage $V_o$. Reference numeral 9 designates an output voltage-drop detecting circuit, 6 a reference voltage source for a detection operation, 7 a rheostat, and 8 a comparator. In the circuitry of FIG. 1, alternating current is converted into direct current by the rectifier circuit 1. The direct current resulting from the conversion is applied to the power control circuit 2 in which a control operation is performed for the purpose of holding the output voltage $V_o$ constant. More specifically, when the output voltage $V_o$ attempts to drop, the error amplifier 3 detects this fact and sends a signal to the power control circuit 2 which so functions as to raise the output. When the output voltage $V_o$ attempts to rise, the error amplifier 3 detects this fact and sends a signal to the power control circuit 2 which so functions as to lower the output. Thus, the output voltage is constantly held at the value set by the rheostat 5. The output voltage $V_o$ is decided by the voltage $E_s$ of the reference voltage source, and the resistors R, r that constitute the rheostat 5. Specifically, $$V_o = \alpha \cdot E_s \quad (1)$$

where $\alpha = r/R$. In FIG. 1, when the output voltage $V_o$ drops below the voltage-drop detection level $V_L$ set by the rheostat 7, the arrangement is such that the comparator 8 issues a detection output to enable detection of the drop in output voltage $V_o$ caused by a drop in the AC power supply voltage, an interruption in the AC power supply, or a malfunction in the rectifying and smoothing circuit 1 or power control circuit 2. In FIG. 1, when it is desired to change the output voltage $V_o$, the rheostat 5 is adjusted to change the value of $\alpha$ in equation (1). At the same time, the rheostat 7 in the voltage-drop detecting circuit 9 is also adjusted to establish a voltage-drop detection level $V_L$ corresponding to the new output voltage $V_o$. It is necessary that the voltage $E_L$ of the reference voltage source 6 be stabilized when $V_o$ and $V_L$ are extremely close to each other.

Figure 2:
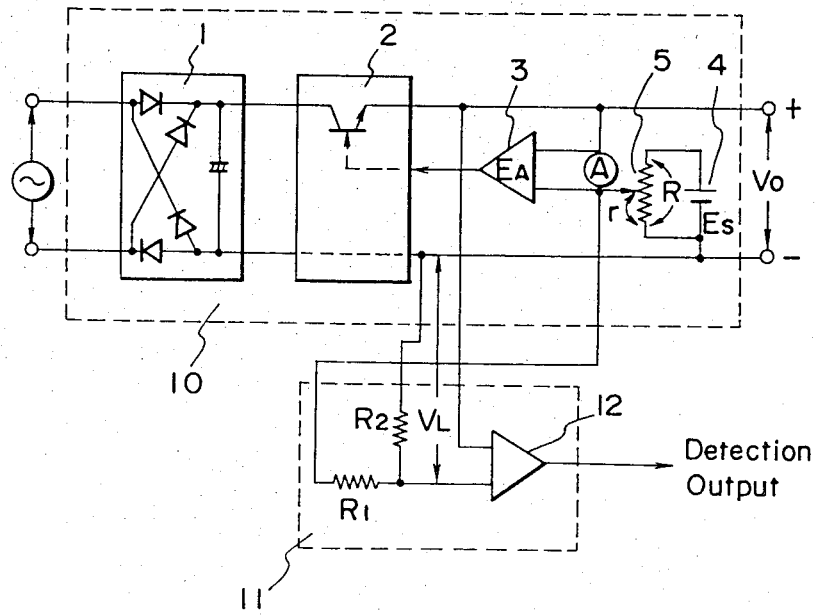
FIG. 2 is a functional block diagram showing an embodiment of an output voltage-drop detecting apparatus for a stabilized DC power source device in accordance with the present invention.

The apparatus of the present invention, in contrast with the above, has the structure shown in FIG. 2 wherein an output voltage-drop detecting apparatus 11 comprising a comparator 12 and resistors $R_1$, $R_2$ is provided. One input terminal of the comparator 12 is connected to the positive output terminal of the stabilized DC power source device 10, while the resistors $R_1$, $R_2$ are connected in series. One end of resistor $R_1$ is connected to the wiper terminal A of the rheostat 5 in the stabilized DC power source 10, and one end of resistor $R_2$ is connected to the negative output terminal of the stabilized DC power source 10. The point of connection of the resistors $R_1$, $R_2$ is connected to the other input terminal of the comparator 12. Portions which are similar to those shown in the conventional apparatus are denoted by like reference characters and are not described here.

In the circuit structure shown in FIG. 2, the potential $V_A$ at the wiper terminal A of rheostat 5 is given by $$V_A = \frac{\frac{r \cdot (R_1 + R_2)}{r + R_1 + R_2}}{R} \cdot E_s = V_o \quad (2).$$

where, if the resistance values are chosen such that $r << R_1 + R_2$, then $$V_A \approx \frac{r}{R} \cdot E_s \quad (3).$$

This output voltage-drop detecting apparatus can be attached to the stabilized DC power source 10 without having any major influence upon the variable range of the rheostat 5.

The potential at the point of connection between the resistors $R_1$ and $R_2$, namely the voltage-drop detection level $V_L$, is given by $$V_L = V_A \cdot \frac{R_2}{R_1 + R_2} \quad (4).$$

If $R_2/(R_1+R_2)$ is replaced by $\beta$, we have
$$V_L = V_A \cdot \beta \quad (5).$$

The voltage detection level can be set by suitably selecting the constant $\beta$.

If we assume that the constant $\beta$ is set to 0.95 in the present embodiment, then $R_2/(R_1+R_2)=0.95$; therefore, $R_2 = 19R_1$.

In connection with the relation between the precision of the resistors $R_1$, $R_2$ and the detection accuracy in the present case, let $r_1$ and $r_2$ indicate the coefficients of precision of the respective resistance values $R_1$ and $R_2$. This gives $$V_L = V_A \cdot \frac{R_2 \cdot r_2}{R_1 \cdot r_1 + R_2 \cdot r_2} = V_A \cdot \frac{19}{\left(\frac{r_1}{r_2}\right) + 19} \quad (6).$$

If it is assumed that the resistors $R_1$, $R_2$ have an accuracy of ±5%, then $0.905 < (r_1/r_2) < 1.105$, and $0.945 \cdot V_A < V_L < 0.954 \cdot V_A$. Hence the regulation of the voltage-drop detection level is held to approximately ±0.5%, so that the voltage drop can be detected to a high degree of precision.

It should be obvious from the foregoing description that the output voltage-drop detecting apparatus of the present invention is useful in a stabilized DC power source for electronic computers and various other electronic devices. It is particularly well-suited for use in stabilized DC power sources that are incorporated in numerical control devices installed in machine plants where the AC power supply voltage is unstable.

What is claimed is:

1. An output voltage-drop detecting apparatus connected to a stabilized DC power source in order to monitor the output voltage of the power source and detect a drop in the output voltage, comprising:

stabilized DC power source means for receiving AC power and producing a stabilized DC output across two output ports, said stabilized DC power source means including a rectifying and smoothing circuit, power control circuit means connected between the rectifying and smoothing circuit and the output ports for regulating the output voltage in response to a control signal, reference voltage generating circuit means for generating a reference voltage by resistance-dividing a reference voltage source, and error amplifier means for generating the control signal in accordance with the difference between the reference voltage and the voltage at one of the output ports; and output voltage drop detecting means for emitting a detection output signal should the voltage across the output ports of the stabilized DC power source means drop past a predetermined level, said output voltage drop detecting means including first and second resistors series-connected between the output of the reference voltage generating means and one of the output ports, said first and second resistors being connected at an intermediate connection point, and a comparator having a first input connected to the intermediate connection point and a second input connected to one of the output ports, the output of the comparator serving as the detection output signal.

2. The circuit of claim 1, wherein the reference voltage generating circuit means comprises a manually adjustable resistance element to resistance-divide the reference voltage source so that the reference voltage level can be manually adjusted.

3. The circuit of claim 2, wherein the first and second resistors are fixed.

* * * * *